United States Patent [19]
Chiba et al.

[11] Patent Number: 6,014,421
[45] Date of Patent: Jan. 11, 2000

[54] RADIATION REDUCTION EXPOSURE APPARATUS AND METHOD OF MANUFACTURING SEMICONDUCTOR DEVICE

[75] Inventors: Yuji Chiba, Utsunomiya; Masami Tsukamoto, Yokohama, both of Japan

[73] Assignee: Canon Kabushiki Kaisha, Tokyo, Japan

[21] Appl. No.: 08/847,404

[22] Filed: Apr. 24, 1997

[30] Foreign Application Priority Data

May 1, 1996 [JP] Japan .................................. 8-110800

[51] Int. Cl.⁷ .................................................... H01L 21/30
[52] U.S. Cl. .................................................. 378/34; 378/35
[58] Field of Search ............................ 378/34, 35; 430/5

[56] References Cited

U.S. PATENT DOCUMENTS

| | | | |
|---|---|---|---|
| 5,003,567 | 3/1991 | Hawryluk et al. | 378/34 |
| 5,390,228 | 2/1995 | Niibe et al. | 378/34 |

FOREIGN PATENT DOCUMENTS

| | | |
|---|---|---|
| 1-175731 | 7/1989 | Japan . |
| 2-100311 | 4/1990 | Japan . |
| 3-96220A | 4/1991 | Japan . |
| 4-225215 | 8/1992 | Japan . |
| 4-307923A | 10/1992 | Japan . |

*Primary Examiner*—David P. Porta
*Attorney, Agent, or Firm*—Fitzpatrick, Cella, Harper & Scinto

[57] ABSTRACT

An X-ray reduction exposure apparatus which provides a preferable image forming system in an entire mask surface area of a reflection type mask, can reduce curvature of the field and astigmatism of the transfer image even in scan exposure and, therefore, can obtain high transfer precision, and the apparatus contributes to the manufacture of a semiconductor element having high reliability. The X-ray reduction exposure apparatus has, as a characteristic feature, a drive mechanism for driving a mask scan stage substantially along the curvature surface of the mask. This drive mechanism is constituted by a main drive section (linear motor or the like) linearly driven in a direction corresponding to the moving direction of a mask scan stage and a sub-drive section (actuator or the like) driven perpendicularly to the drive direction, otherwise, constituted by a main drive section and a guide having a shape which is the same as the curvature surface shape of the mask.

16 Claims, 5 Drawing Sheets

RADIATION REDUCTION EXPOSURE APPARATUS AND METHOD OF MANUFACTURING SEMICONDUCTOR DEVICE

BACKGROUND OF THE INVENTION

1. Field of the Invention

The present invention relates to a reduction radiation exposure apparatus used in a semiconductor manufacturing apparatus and using a reflection type mask, and to a method of manufacturing a semiconductor element using the reduction radiation exposure apparatus.

2. Description of the Related Art

In recent years, in order to increase the degree of integration and operation speed of a solid device in an LSI or the like, micropatterning of the circuit pattern has advanced. In circuit pattern formation in the process of manufacturing such an LSI, a reduction projection exposure apparatus using vacuum ultraviolet rays as an exposure light is popularly used. In this case, since the resolution is dependent on a wavelength $\lambda$ of an exposure light and a numerical aperture NA of a projection optical system, a resolution limit is improved by increasing the numerical aperture NA. However, because of a decrease in the depth of focus (D.O.F.) and the difficulty of refraction optical system designing/manufacturing techniques, the resolution limit is almost close to the lower limit. For this reason, the exposure wavelength $\lambda$ is shortened to improve the resolution. For example, the light source shifts to i-lines ($\lambda$=365 nm) and a KrF excimer laser ($\lambda$=248 nm). However, because of a theoretical limit depending on a wavelength, even if the conventional exposure technique is improved, a resolution of 0.1 $\mu$m or less cannot be easily obtained.

As an exposure technique in the future, a technique for forming a micropattern using high-intensity X-rays from an SR light source or the like has been proposed. X-ray exposure methods are roughly classified into a proximity X-ray exposure method using soft X-rays having a wavelength of 0.5 nm to 2 nm and a reduction projection exposure method using soft X-rays and a reflection type mask. In the former, the present applicant proposed an exposure apparatus described in Japanese Unexamined Patent Publication No. 2-100311. In this method, since an exposure wavelength is short, a high resolution of 0.1 $\mu$m or less may be theoretically obtained. In the proximity X-ray exposure method, a transmission type mask is used. A portion which is allowed to transmit X-rays in the proximity X-ray mask is generally constituted by a 35 mm×35 mm thin film which consists of a light-element material such as SiN·SiC, called a membrane, having a thickness of about 2 $\mu$m. As a portion which absorbs X-rays in the proximity X-ray mask, a circuit pattern called an absorber and consisting of a heavy metal such as W, Au, or Ta and having a thickness of about 0.5 to 1.5 $\mu$m is formed on the membrane. In the proximity X-ray mask, since the circuit pattern is formed on the membrane having very low rigidity, the following problems are pointed out. That is, the circuit pattern is distorted by stress of the absorber or an external force or the like generated when the X-ray mask is placed in a predetermined exposure apparatus, so that a desired circuit pattern cannot be transferred to the resist on the wafer. In particular, in the proximity X-ray exposure method, since the pattern of the proximity X-ray mask is transferred to the resist in a one-to-one magnification, the pattern distortion on the proximity X-ray mask is transferred to the resist at a one-to-one magnification. For this reason, an amount of distortion allowed in the X-ray mask is very small, and a technique for forming the X-ray mask is a problem.

On the other hand, an X-ray reduction projection exposure method of the later using vacuum ultraviolet rays or soft X-rays as an exposure light and using a reflection type mask has attracted attention. This is because the reflection type mask can be manufactured easier than the proximity X-ray mask and can obtain image performance having high resolution power. FIG. 1 shows an exposure optical system according to an X-ray reduction projection exposure method represented by one described in Japanese Unexamined Patent Publication No. 4-225215 or the like. The vacuum ultraviolet rays or soft X-rays are emitted from an undulator light source 101, reflected from a convex total reflection mirror 102, reflected from a concave multi-layered reflection mirror 103, and then illuminate the reflection type mask 104. A multi-layered film which can almost regularly reflect the vacuum ultraviolet rays or soft X-rays is formed on the reflection type mask 104. A predetermined pattern consisting of an X-ray absorber is formed on the multi-layered film. The vacuum ultraviolet rays or soft X-rays reflected by the reflection type mask reach the wafer 106 through reduction projection optical system mirrors 105a to 105d to form the image of a predetermined pattern.

In order to align the reflection type mask 104 and the wafer 106 or enlarge the illumination area of the reflection type mask 104 and the exposure area of the wafer 106 in the optical system shown in FIG. 1, a mask scan stage 107 and a wafer scan stage 108 are used to synchronously scan the reflection type mask 104 and the wafer 106. Since the wavelength of the vacuum ultraviolet rays or soft X-rays used in exposure and illumination ranges from about 5 nm to 20 nm, a theoretical resolution power depending on the wavelength of exposure light is improved.

The present applicant proposed, in Japanese Unexamined Patent Publication No. 1-175731, an exposure apparatus which uses a reflection type mask having a curved shape to correct curvature of the field of the projection optical system. In this case, the shape of the reflection type mask 104 shown in FIG. 1 is a concave curved shape. In this proportion, image performance such as curving of an image surface and astigmatism caused by an X-ray reflection mirror used in X-ray reduction projection cannot be completely corrected by the X-ray reflection mirror shape. When the X-ray mask to be used is constituted by a curved shape such as a spherical shape, curvature of field or astigmatism on a projection surface can be corrected to improve image performance, thereby obtaining preferable optical characteristics.

In the exposure apparatus using the X-ray reduction optical system shown in FIG. 1, in the description of the prior art, because of improvement of resolution and an increase in transfer area, a scan exposure scheme in which a stage has a mask formed thereon, and a mask scan stage moves synchronously with a wafer scan stage is mainly used. However, when a curved mask described in Japanese Unexamined Patent Publication No. 1-175731 to correct curvature of field or astigmatism in the scan exposure scheme, out-of-focus occurs in the transfer surface in relation to a D.O.F. (Depth Of Focus), and preferable pattern projection cannot be achieved over the entire area. This is disadvantageous.

SUMMARY OF THE INVENTION

It is an object of the present invention to provide a radiation reduction exposure apparatus which provides a preferable image forming system in the entire area of the mask to surface of a reflection type mask, make it possible to reduce curvature of a field and astigmatism of a transfer image even in scanning exposure, and, therefore, obtain a high transfer precision, and to achieve improvement of reliability of a semiconductor element manufactured by using the radiation reduction exposure apparatus.

Another object of the present invention will be apparent in the embodiment to be described later.

In this invention, it is assumed that the radiation includes X-rays, light rays, or the like.

DESCRIPTION OF THE PREFERRED EMBODIMENTS

Embodiments of the present invention will be described below with reference to the accompanying drawings.

Figure 1:
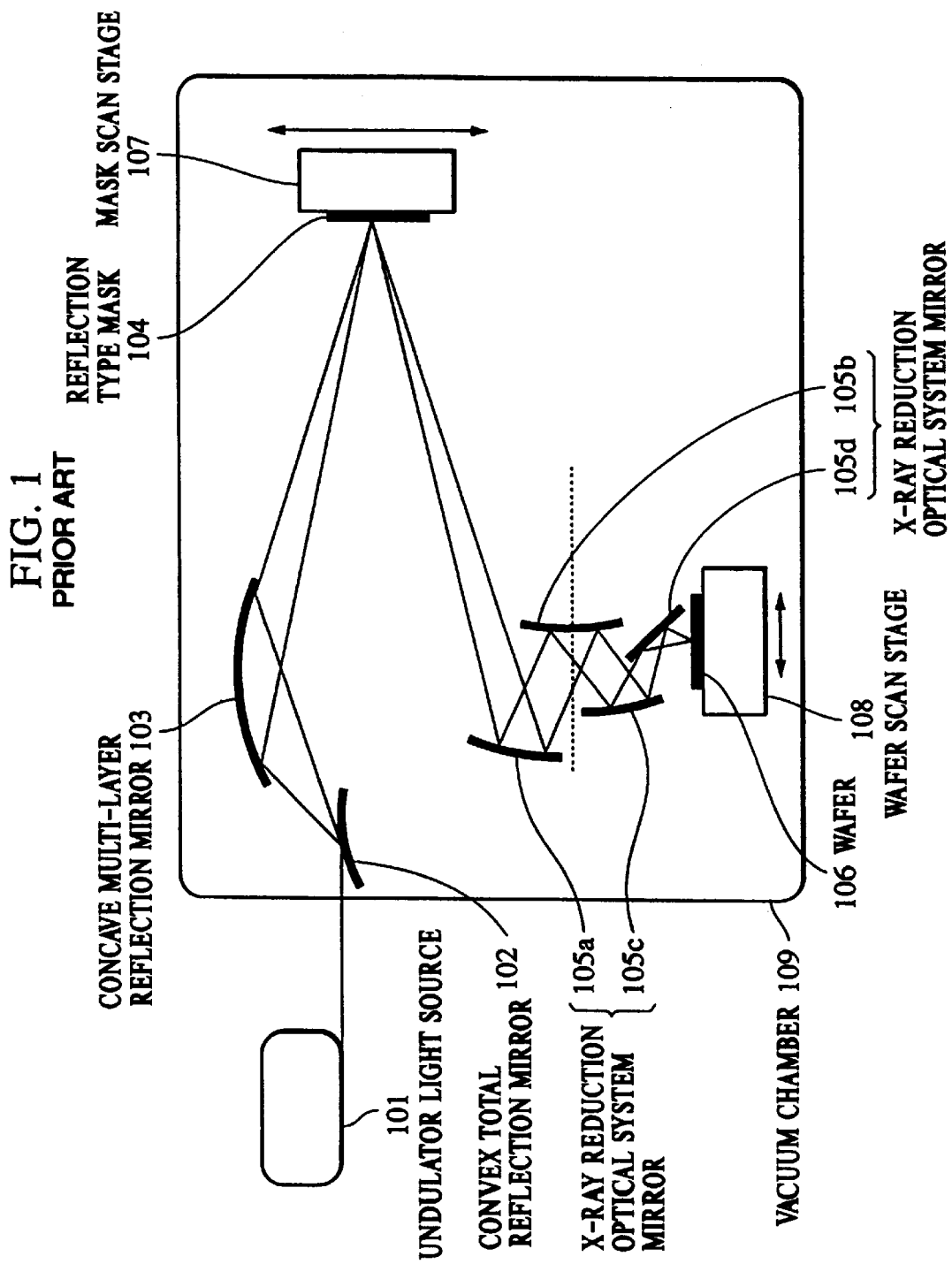
FIG. 1 is a schematic view showing a prior art optical system.
Figure 2A:
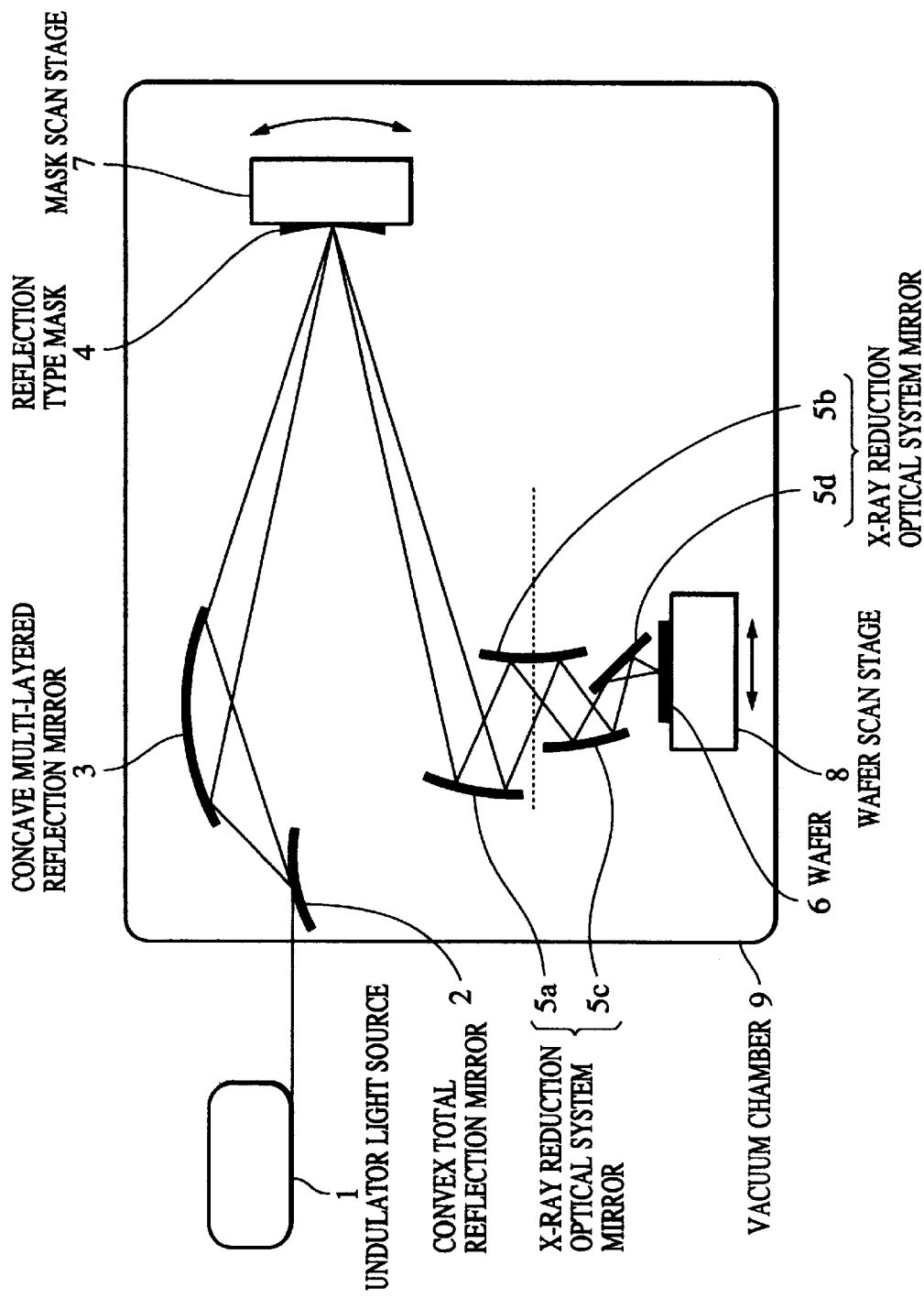
FIG. 2A is a schematic view showing an X-ray reduction exposure apparatus according to an embodiment of the present invention.
Figure 2B:
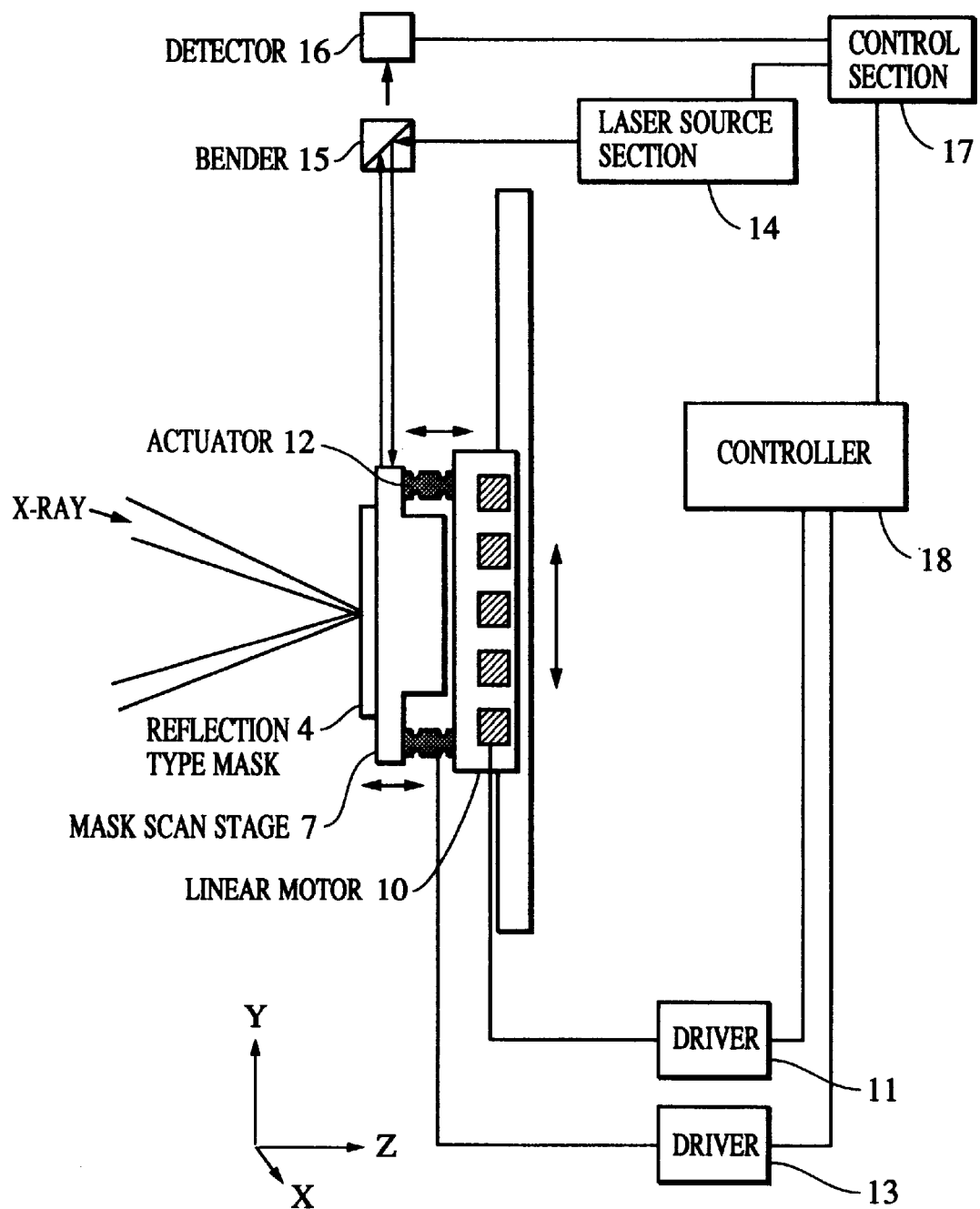
FIG. 2B is an enlarged view showing the mask scan stage in FIG. 2A, and for explaining a mechanism for driving the mask scan stage.
Figure 3A:
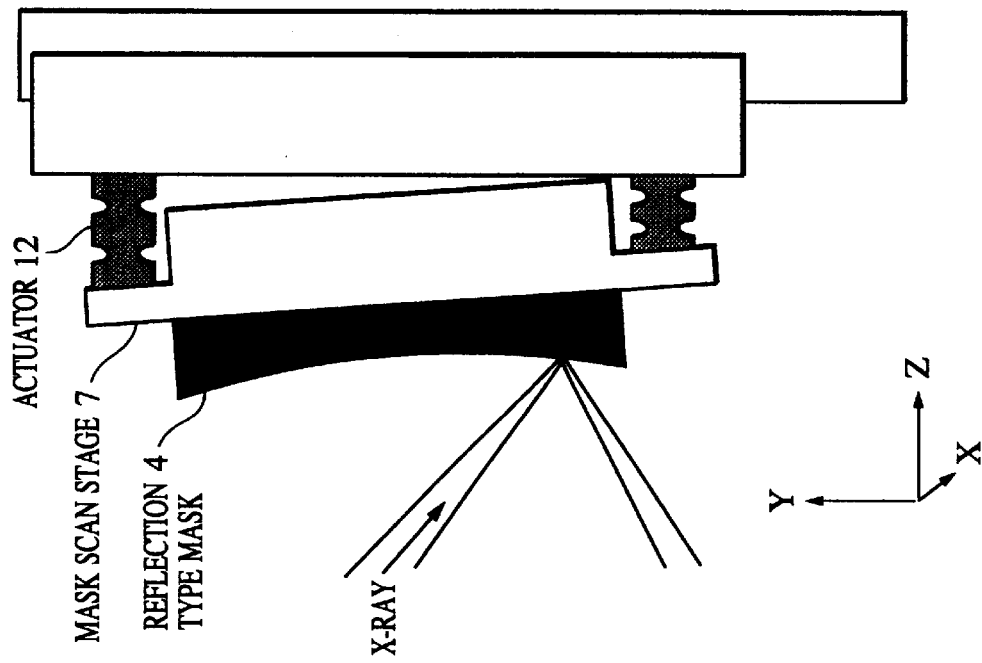
FIG. 3A is an enlarged view for explaining a state wherein only the main driving section in FIG. 2B is being driven.
Figure 3B:
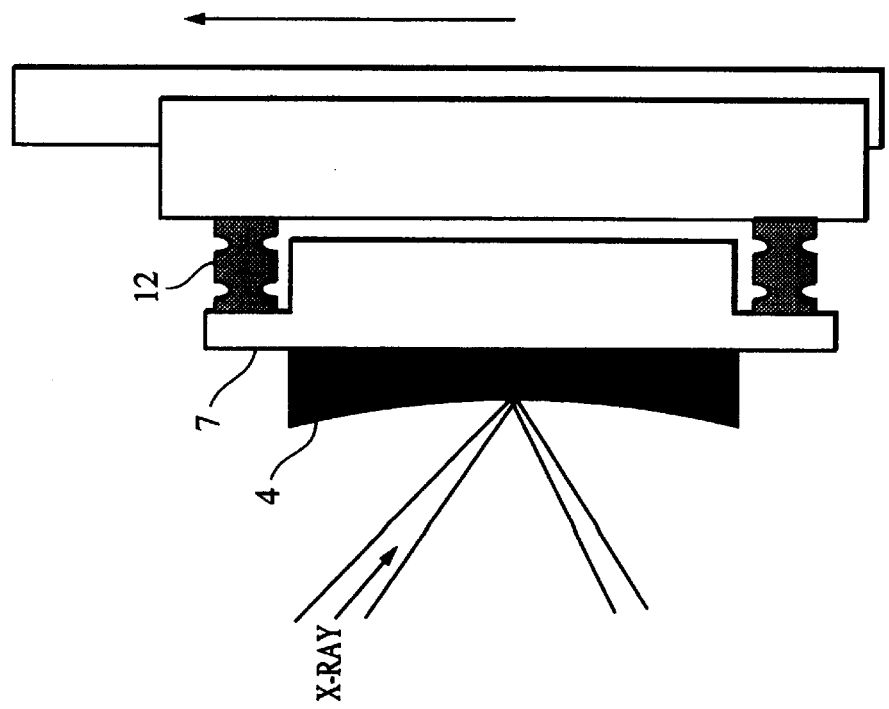
FIG. 3B is an enlarged view showing a state wherein the sub-driving section in FIG. 2B is being driven.

FIG. 2A is a schematic view showing an X-ray reduction exposure apparatus using a reflection type mask according to an embodiment of the present invention, and FIG. 2B is an enlarged view showing the mask scan stage in FIG. 2A, and for explaining a mechanism for driving the mask scan stage. FIG. 3A is an enlarged view for explaining a state wherein only the main driving section in FIG. 2B is being driven, and FIG. 3B is an enlarged view showing a state wherein the sub-driving section in FIG. 2B is being driven.

Referring to FIG. 2A, vacuum ultraviolet rays or soft X-rays are emitted from an undulator light source 1. A convex total reflection mirror 2 and a concave multi-layered reflection mirror 3 reflect X-rays from the undulator light source 1 and then illuminate a reflection type mask 4. The reflection type mask 4 has a concave curved shape, and a multi-layered film, which can regularly reflect vacuum ultraviolet rays or soft X-rays and consists of Mo/Si, is formed on the reflection type mask 4. A predetermined pattern is formed on the multi-layered film by an X-ray absorber such as W. The vacuum ultraviolet rays or soft X-rays reflected from the reflection type mask 4 are reflected by multi-layered film reflection mirrors 5a, 5b, and 5c of the reduction projection exposure optical system and reflected by a multi-layered reflection mirror 5d at 90° to form the image of a predetermined pattern. A mask scan stage 7 and a wafer scan stage 8 are shown in FIG. 2A, and are used to synchronously scan the reflection type mask 4 and a wafer 6. A vacuum chamber 9 is used to keep the entire exposure apparatus in a high vacuum state for the following reason. That is, since X-rays are largely attenuated in a gas atmosphere, the entire exposure apparatus must be kept in a high vacuum state.

In this embodiment, a reflection type mask having a curved shape is proposed in Japanese Unexamined Patent Publication No. 1-175731. In this case, setting of the X-ray optical system is performed by the following values:

NA=0.1

λ=13 nm resolution=0.1 μm or less image surface size=28×28 mm magnification=1/5 times.

The curved shape of the reflection type mask 4 used at this time proposed values used in Embodiment 1 in Japanese Unexamined Patent Publication No. 1-175731:

mask curvature radius r=1×10$^5$ mm.

When the D.O.F. (Depth Of Focus) of the optical system is calculated by using the above values, D.O.F.=0.65 μm The level difference calculated by the curvature and field angle of the reflection type mask 4 is about 12.3 μm. Therefore, when the mask scan stage 7 is linearly driven, a transferred image is blurred. In this embodiment, when a method of driving the mask scan stage 7 is performed such that the curvature center of the mask surface is caused to coincide with the drive curvature center of the mask scan stage 7, a preferable focus position can be maintained in the entire area of the reflection type mask 4.

In FIG. 2B, the mask scan stage 7 described above is shown in detail. The coordinate system used in the explanation is shown at the left lower position in FIG. 2B. The mask scan stage 7 uniformly moves on the mask pattern surface of the reflection type mask 4 having the curvature surface shape described above. Therefore, the drive distance of the mask scan stage 7 is 200 mm in this embodiment in consideration of an acceleration/deceleration area of the stage. The reflection type mask 4 is held by the mask scan stage 7 by an electrostatic chucking scheme. In this embodiment, although a mask chuck using the electrostatic adsorbing scheme is used, any mechanical means may be used. A linear motor 10 of the main drive section drives the mask scan stage 7 in a Y direction. In this embodiment, although the linear motor is used, another linear motion mechanism may be used. A driver 11 of the main drive section is a driver for driving the linear motor 10. Actuators 12 of the sub-drive section have a short rotational drive distance in a Z direction and around an X axis on the mask scan stage 7, so that PZT elements are used as the actuators 12. A driver 13 of the sub-drive section is a drive for driving the actuator 12.

In FIG. 2B, the guide section and the mask adsorbing section of the linear motor 10 use two actuators 12. However, actually, three actuators 12 isotropically arranged with respect to the mask surface are used. A leaf spring is used as a drive guide of the mask adsorbing section to fasten the guide section of the linear motor 10 to the mask adsorbing section. However, FIG. 2B conveniently shows the actuators 12 to avoid cumbersome illustration. The three actuators 12 can be independently driven. A laser light source section 14 is a laser light source section of a laser interferometer system for measuring the position of the mask scan stage 7. A bender 15, a detector 16, and a control section 17 for the laser interferometer system are shown in FIG. 2B. A laser beam from the laser light source section 14 is bent by the bender 15 and reflected from an interferometer reflection mirror arranged on a side surface of the mask scan stage 7, and returns to the detector 16. The position of the laser beam in a Y direction and an ωx direction (rotation around the X axis) is measured by the laser interferometer system.

Since FIG. 2B is a schematic view, a measuring section in the ωx and ωz directions is omitted in FIG. 2B. In this embodiment, since a drive stroke in the ωx direction is small as described above, the position in the ωx direction can be measured by the laser interferometer system. Measurement in an ωy direction is performed to monitor the other component generated when the mask scan stage 7 is driven in the Y direction. A controller 18 is a controller for controlling the mask scan stage 7.

The characteristic feature of a driving method according to this embodiment will be described below with reference to FIGS. 3A and 3B.

Since an X-ray irradiation area formed on the mask surface is small as a characteristic feature of the X-ray reduction exposure apparatus, the reflection type mask 4 and the wafer 6 (FIG. 2A) are synchronously scanned in accordance with reduction magnification. X-rays which are reflected from the concave multi-layered reflection mirror 3 (FIG. 2A) illuminate the reflection type mask 4. Since the D.O.F. obtained at this time has a narrow range, the image forming position on the reflection type mask 4 is always held at a predetermined position with respect to the Z direction, and the mask scan stage 7 is scanned in the Y direction such that the normal direction of the fine area surface of the X-ray irradiation area on the reflection type mask 4 coincides with a predetermined direction. In other words, the mask surface of the reflection type mask 4 is moved along the mask curvature surface (in this embodiment, curvature radius=200 m) of the reflection type mask 4 with movement of the mask scan stage 7 such that an incident angle to the multi-layered mirror does not change.

As a method of driving the mask scan stage 7 described above, the following method is used. A controller 18 for controlling the mask scan stage 7 has tables for driving the actuators 12 which are set by the shape of the reflection type mask 4 used in exposure in advance to drive the actuator 12 in synchronism with driving of the mask scan stage 7 in the Y direction. Since the tables used in this case are formed as ones which are applied to the mask surface shapes of the respective reflection type masks 4, a drive error is not caused by the differences among the reflection type masks 4. The mask scan stage 7 is driven in synchronism with the wafer scan stage 8. At this time, the other component of the mask scan stage 7 is fed back to the wafer scan stage 8 in response to an output signal from the laser interferometer system control section 17 to perform scanning exposure at high precision.

As has been described above, according to this embodiment, the mask scan stage 7 has the actuators 12 which serve as a Z-axis drive mechanism and a tilt mechanism. When the mask surface of the reflection type mask 4 is moved along the curvature surface of the reflection type mask 4 with movement of the mask scan stage 7, exposure transferring can be performed over the entire mask pattern area within the depth of focus of the image forming system. Therefore, preferable exposure transferring can be performed in a large area such that curvature of field caused by the reflection type mask 4 having a curvature surface and astigmatism are reduced.

The second embodiment will be described below.

Figure 4:
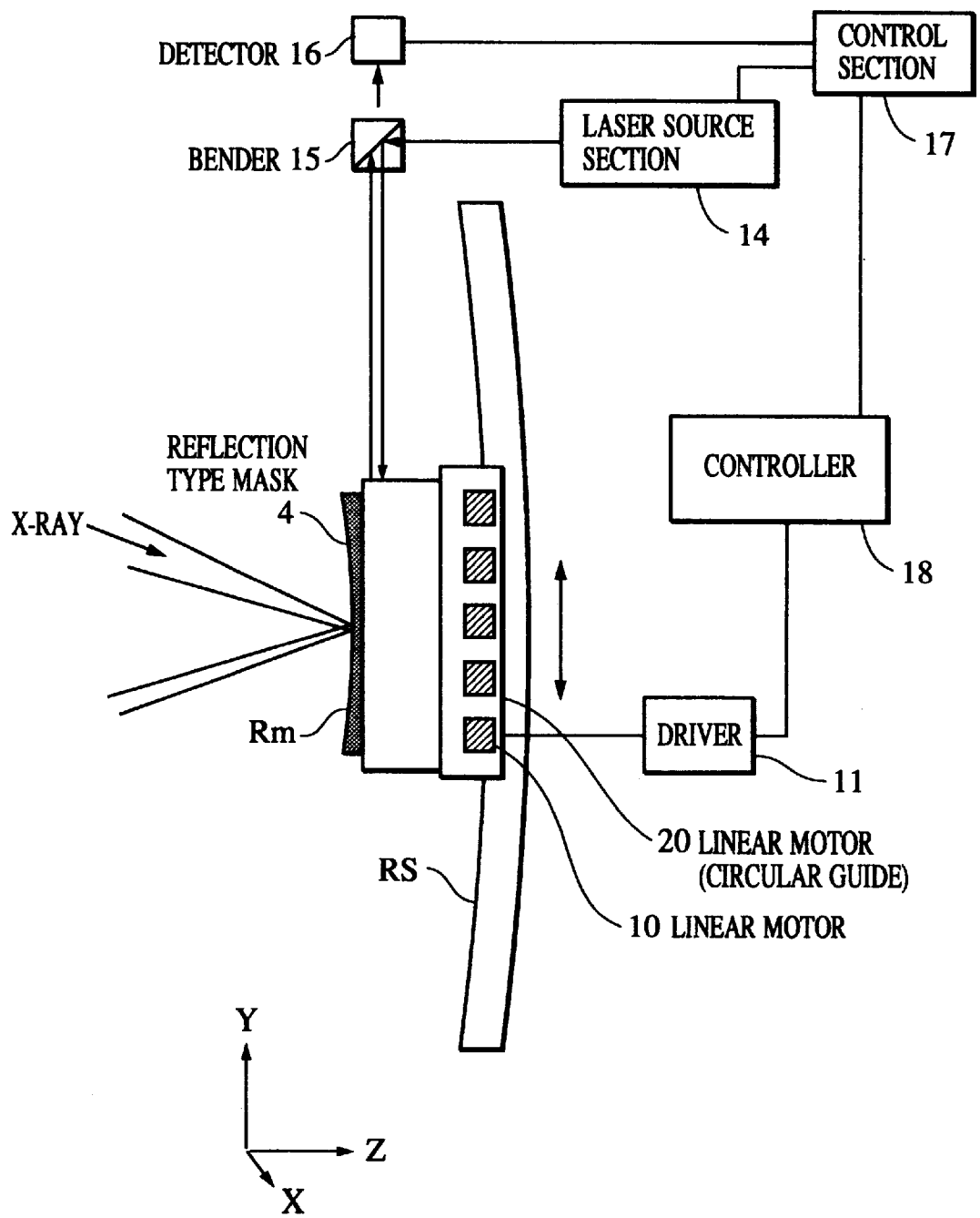
FIG. 4 is a view for explaining a drive mechanism according to the second embodiment of the present invention.

FIG. 4 is a view for explaining a drive mechanism according to the second embodiment of the present invention.

A description of common features in the first embodiment and in FIG. 4 will be omitted. A guide section 20 of a linear motor 10 has a predetermined curvature. The guide section 20 is a so-called gonio-stage having a large curvature radius. In this case, the curvature radius of the mask surface of a reflection type mask 4 is represented by Rm, and the curvature radius of the guide section 20 of a mask scan stage 7 is represented by Rs. The mask scan stage 7 is arranged in the exposure apparatus such that the curvature centers of Rm and Rs coincide with each other, and an angle between the irradiation direction of X-rays and the mask surface is set to be a predetermined angle. When the mask scan stage 7 is driven in a Y direction in the above apparatus arrangement, as in the first embodiment, the image forming position of the reflection type mask 4 is always held at a predetermined position with respect to the Z direction, and the normal direction of the fine area surface of the X-ray irradiation area on the reflection type mask 4 coincides with a predetermined direction. In other words, the mask surface of the reflection type mask 4 can be moved along the mask curvature surface (in this embodiment, curvature radius=200 m) of the reflection type mask 4 with movement of the mask scan stage 7.

In this embodiment, in addition to the characteristic feature of the first embodiment, drive scanning control of the mask scan stage 7 can be easily performed because a drive mechanism in the Z direction and a tilt mechanism are not required. Therefore, the entire mechanism and control can be simplified, so that costs of the X-ray reduction exposure apparatus can be reduced.

As has been described above, when the drive mechanism which can drive the mask scan stage along the curvature surface of the mask is arranged, even if a reflection type mask constituted by a curvature surface is used in a radiation reduction exposure apparatus, a preferable image forming system can be provided in the entire mask surface of the reflection type mask. For this reason, curvature of the field and astigmatism of a transfer image can be reduced in scan exposure. Therefore, a radiation reduction exposure apparatus being capable of high transfer precision can be provided.

As a result, the reliability of a semiconductor element manufactured by using the radiation reduction exposure apparatus can be advantageously improved.

What is claimed is:

1. An exposure apparatus for causing radiation rays to scan and illuminate the surface of a reflection type mask having a curved surface with a radius of curvature, to cause reflected radiation rays from said reflection type mask to scan and expose an object to be exposed, said apparatus comprising:

a projection system for projecting reflected radiation rays from said reflection type mask onto the object to be exposed; and a drive mechanism for moving said reflection type mask along an arcuate path having a radius of curvature related to the radius of curvature of the mask.

2. An apparatus according to claim 1, wherein said projection system forms a reduced image of a pattern formed on the curved surface of said reflection type mask on the object to be exposed.

3. An apparatus according to claim 2, wherein the radiation rays are X-rays.

4. An apparatus according to claim 3, wherein said projection system is a mirror optical system.

5. An apparatus according to claim 1, further comprising a scan stage for moving the object to be exposed in a scanning direction.

6. An apparatus according to claim 5, wherein said drive mechanism has a main drive section for moving said reflection type mask in a first direction in accordance with a direction of movement of said scan stage and a sub-drive section for driving said reflection type mask in a second direction perpendicular to the first direction.

7. An apparatus according to claim 6, wherein said reflection type mask is moved along the arcuate path by cooperation between said main drive section and said sub-drive section.

8. An apparatus according to claim 5, wherein said drive mechanism has a main drive section for moving said reflection type mask in a direction substantially corresponding to the direction of movement of said scan stage and a guide having a shape along the arcuate path.

9. An apparatus according to claim 1, wherein the arcuate path has a radius of curvature substantially equal to the radius of curvature of the mask.

10. A method of manufacturing a semiconductor element comprising the steps of:

illuminating the surface of a reflection type mask having a curved surface with a radius of curvature by radiation rays, said reflection type mask having a pattern formed thereon;

moving said reflection type mask along an arcuate path having a radius of curvature related to the radius of curvature of the mask;

moving an object to be exposed in accordance with movement of said reflection type mask; and exposing the object to be exposed by reflected radiation rays from said reflection type mask, the exposure being performed through a projection system, the exposure being performed during movement of said reflection type mask and movement of the object to be exposed, and a pattern for manufacturing a semiconductor element being formed on the object to be exposed by the exposure.

11. A method according to claim 10, wherein the projection system forms a reduced image of a pattern formed on the curved surface of said reflection type mask on the object to be exposed.

12. A method according to claim 11, wherein X-rays are used as the radiation rays.

13. A method according to claim 12, wherein a mirror optical system is used as the projection system.

14. A method according to claim 10, wherein the arcuate path has a radius of curvature substantially equal to the radius of curvature of the mask.

15. An exposure apparatus for causing radiation rays to scan and illuminate the surface of a reflection type mask having a curved surface with a radius of curvature, to cause reflected radiation rays from the reflection type mask to scan and expose an object to be exposed, said apparatus comprising:

a first stage movable with the reflection type mask held thereby;

a second stage movable with the object to be exposed held thereby;

a projection system projecting reflected radiation rays from the reflection type mask held by said first stage onto the object to be exposed held by said second stage; and a controller controlling motion of said first stage in the scanning and illuminating of the reflection type mask, said controller controlling the motion of said first stage so as to move said reflection type mask along an arcuate path having a radius of curvature related to the radius of curvature of the mask.

16. An apparatus according to claim 15, wherein the arcuate path has a radius of curvature substantially equal to the radius of curvature of the mask.

\* \* \* \* \*

UNITED STATES PATENT AND TRADEMARK OFFICE
CERTIFICATE OF CORRECTION

PATENT NO. : 6,014,421
DATED : January 11, 2000
INVENTOR(S) : Yuji Chiba, et al.

It is certified that error appears in the above-indentified patent and that said Letters Patent is hereby corrected as shown below:

COLUMN 2:
    Line 4, "later" should read --latter method--.
    Line 59, "scheme," should read --scheme is used,--.

COLUMN 3:
    Line 2, "to" should read --to the--.
    Line 3, "curvature of a field" should read --the curvature of field--.

COLUMN 4:
    Line 14, "μm" should read --mm.--.

COLUMN 5:
    Line 65, "gonio-stage" should read --swivel-stage--.

Signed and Sealed this

Twenty-seventh Day of March, 2001

Attest:

NICHOLAS P. GODICI

*Attesting Officer*       *Acting Director of the United States Patent and Trademark Office*